United States Patent [19]

Kompanek

[11] 4,056,654

[45] Nov. 1, 1977

[54] COATING COMPOSITIONS, PROCESSES FOR DEPOSITING THE SAME, AND ARTICLES RESULTING THEREFROM

[75] Inventor: Harry Wilfred Kompanek, Santa Barbara, Calif.

[73] Assignee: KKF Corporation, Santa Barbara, Calif.

[21] Appl. No.: 598,892

[22] Filed: July 24, 1975

[51] Int. Cl.$^2$ ............................................. B32B 00/00
[52] U.S. Cl. ....................................... 428/409; 29/25; 29/35; 252/62.9; 252/519; 427/100; 427/126; 427/180; 428/539
[58] Field of Search .................. 428/539, 409; 427/372 R, 100, 126, 180; 252/62.9 R, 519; 317/262 F; 29/25.35; 310/8

[56] References Cited

U.S. PATENT DOCUMENTS

| | | | |
|---|---|---|---|
| 2,218,058 | 10/1940 | Stålhane | 427/126 |
| 2,449,484 | 9/1948 | Jaffe | 252/62.9 R |
| 2,463,109 | 3/1949 | Jaffe | 252/62.9 R |
| 2,669,666 | 2/1954 | Mason et al. | 252/62.9 R |
| 2,680,720 | 6/1954 | Jaffe | 252/69.2 R |
| 3,002,861 | 10/1961 | Suchoff | 427/126 |
| 3,006,857 | 10/1961 | Kulcsar | 252/62.9 |
| 3,085,184 | 4/1963 | Nitsche et al. | 252/69.2 R |
| 3,318,731 | 5/1967 | Blum | 427/126 |
| 3,649,353 | 3/1972 | Ulrich | 427/100 |
| 3,811,938 | 5/1974 | Hirose | 427/126 |
| 3,844,967 | 10/1974 | Brixner | 252/69.2 R |
| 3,910,796 | 10/1975 | Asahara | 252/519 |
| 3,920,882 | 11/1975 | Venkato | 427/372 R |
| 3,924,025 | 12/1975 | Kolb et al. | 427/372 R |
| 3,949,323 | 4/1976 | Bierlein | 252/69.2 R |

*Primary Examiner*—Ronald H. Smith
*Assistant Examiner*—Janyce A. Bell
*Attorney, Agent, or Firm*—Anthony J. Criso; R. H. Childress

[57] ABSTRACT

Ceramic dielectric coating compositions are disclosed as well as processes for depositing the coating compositions on a substrate and the coated article resulting therefrom. A ferroelectric or piezoelectric powder material such as the barium titanate type or lead zirconate-titanate type is mixed with a phosphate additive and water to form an acidic flowable mass with a consistency suitable for depositing by various means on a substrate. Depositing means include painting, dipping, spraying, and silk-screen techniques. After deposition on the substrate, the coating composition is dried, preferably at an elevated temperature, to form a composite article of the substrate with an adherent ferroelectric or piezoelectric coating composition thereon.

37 Claims, No Drawings

COATING COMPOSITIONS, PROCESSES FOR DEPOSITING THE SAME, AND ARTICLES RESULTING THEREFROM

BACKGROUND OF THE INVENTION

This invention relates to ceramic dielectric coating compositions, processes for depositing the coating compositions on a substrate, and the coated articles resulting therefrom. More particularly, this invention relates to a ferroelectric or piezoelectric coating composition containing a phosphate additive, a process for applying the composition to a substrate and the resulting composite article of the substrate with an adherent coating composition thereon.

The ferroelectric effect is the property of certain crystalline dielectric materials when polarized to retain their polarization. The piezoelectric effect is the property of certain crystalline dielectric materials when polarized to generate an electric field or potential of one polarity when a compressive force is applied and the polarity is reversed when a tensile or stretching force is applied. This effect is reciprocal in that the material will tend to compress if an electric field or potential of one polarity is applied across the material and the material will tend to expand if the polarity is reversed.

Piezoelectric materials were initially limited to crystals such as quartz and rochelle salt which were grown under controlled conditions as single crystals and were sliced into functional pieces with selected orientations with respect to crystal axes. More recently, piezoelectric materials which include a variety of polycrystalline ceramics can be processed into functional parts in a more economical manner by using techniques common to ordinary ceramic products. The parts are formed "green" and must be fired at high temperatures (about 1300° C.) to fuse the microscopic granules and produce a hard ceramic which can exhibit the piezoelectric effect after the application of a polarizing electric field. The fired parts may then be sliced or shaped with abrasive processes such as grinding or polishing usually being required. As can be appreciated, any means which obviates or minimizes costly slicing and abrading procedures would represent a contribution to this art.

One approach to obviate or minimize such procedures has been to produce piezoelectric films or coatings. An organic type binder vehicle can be employed with a powdered piezoelectric material but the vehicle either tends to distort the film or coating as it volatilizes during sintering of the material or else is so viscous as to prevent the formation of a smooth film or coating. Alternatively, the material can be powdered and milled with distilled water and then sprayed onto a substrate, dried and sintered with layers being successively built up in this manner. These coating approaches have limitations or disadvantages, such as, the coatings require sintering after application which utilizes high temperatures and oftentimes results in deficiencies in the coating and the coatings require some type of bonding to a substrate after formation which utilizes an added and costly procedure and oftentimes results in deficiencies in the bond. As can be appreciated, a coating which is dried or cured at relatively low temperatures, can be applied over various areas and shapes, as desired, and strongly adheres to or is formed integral with the substrate would represent an advancement in or contribution to this art.

SUMMARY OF THE INVENTION

The present invention contemplates a ferroelectric or piezoelectric coating composition which can be applied by economical and simple means to a substrate which can have various surface shapes and dimensions with the coating being effectively adhered to the substrate.

In accordance with one aspect of the invention a composition comprising a finely divided ceramic dielectric material and a phosphate additive is provided which exhibits, as a coating composition, excellent mechanical and ferroelectric or piezoelectric properties.

In accordance with another aspect of the invention an acidic aqueous slurry is prepared by admixing a finely divided ceramic dielectric material, water and a phosphate additive, the slurry is deposited as a coating composition to a desired thickness on a suitable substrate by various means and thereafter the coating composition is dried or cured at a sufficient temperature to adhere the coating to the substrate.

In accordance with still another aspect of the invention a composite article of a substrate with a ferroelectric or piezoelectric coating composition adhered thereto is provided which can be advantageously used in many and various ferroelectric or piezoelectric applications.

DESCRIPTION OF TYPICAL OR PREFERRED EMBODIMENTS

What is set forth herein is intended primarily as exemplary to enable those skilled in the art to practice the present invention and it should therefore be understood that, within the scope of the appended claims and their permissible equivalents, the invention may be practiced in other ways than as specifically described.

Although any finely divided dielectric ceramic material of the ferroelectric type or piezoelectric type can be used in the present invention, it is preferred that the material be of the barium titanate type, the lead zirconate-titanate type, or the lead metaniobate type. The barium titanate type material includes barium titanate as well as other titanates which contain barium in a predominant amount along with one or more other metallic additives, usually added as an oxide or carbonate in preparing the material, of magnesium, calcium, strontium, bismuth, neodymium, lanthanum rare earth, lead cerium, antimony, tin and niobium. U.S. Pat. No. 2,486,560 (Gray) is representative of this type of ferroelectric or piezoelectric material.

The lead zirconate-titanate type material exhibit the perovskite type crystal structure and includes lead zirconate-titanate in which the zirconate-titanate weight ratio may vary from 95 zirconate: 5 titanate, which typically exhibits piezoelectric properties such as low dielectric constant, to 52 zirconate: 48 titanate, which typically exhibit the best piezoelectric properties, as well as other zirconates-titanates which contain lead in a predominant amount along with one or more other metallic additives or magnesium, calcium strontium, bismuth, neodymium, lanthanum rare earth, cerium, antimony, tin, chromium, iron, nickel, cobalt and barium. U.S. Pat. Nos. 2,708,244 (Jaffe), 2,906,710 (Kulcsar et al), 2,911,370 (Kulcsar), 3,006,857 (Kulcsar), 3,068,177 (Sugden) and 3,144,411 (Kulcsar and Jaffe) are representative of this type of ferroelectric or piezoelectric material.

The lead metaniobate type material includes lead metaniobate as well as other metaniobates which contain lead in a predominant amount along with one or more of the metal additives previously disclosed above with the barium titanates and lead zirconate-titanates.

The particle size of the ceramic material useful in the present invention can be varied depending upon, inter alia, the desired characteristics of the resulting coating. In general, the smaller the particle size of the material the more dense the finished coating with the result of a better coupling coefficient for the coating. Therefore, finely divided materials which include powders and particularly powders having particle sizes of from about −140 mesh (U.S. Sieve) or 105 micrometers to about −40 mesh (U.S. Sieve) or 37 micrometers can be used although it is preferred that such be smaller than about −200 mesh (U.S. Sieve) or 74 micrometers.

Many and various substrate materials are useful in the present invention and such materials include metallic substrates, particularly those of the aluminum, nickel, tin, titanium and silicon, molybdenum, graphite and steel type including alloys containing such metals in major or predominant amounts such as an alloy of 29% Ni, 17% Co, 0.2% Mn and balance iron ("Kovar" commercially available from Westinghouse Corporation) and non-metallic dense or hard substrates, particularly those containing an inorganic dielectric ceramic type material such as those piezoelectric or ferroelectric type materials of the present invention.

The phosphate additives which can be employed in the present invention include any phosphate compound or composition which is water soluble in an acidic solution. Such additives include, for example, orthophosphoric acid, pyrophosphoric acid, polyphosphoric acid, and metaphosphoric acid as well as the water soluble salts of each. Typical water soluble salts include the alkali metal salts, preferably sodium and potassium; alkaline earth metal salts, preferably calcium and magnesium; ammonium salts, aluminum salts; iron salts, preferably ferric; chromium salts and the like. Of the foregoing, orthophosphoric acid, the alkali metal salts, particularly sodium and potassium, and ammonium salts thereof, and mixtures of such materials, are preferred. Accordingly the term phosphate as used herein contemplates additives capable of providing the phosphate ion.

The amount of the phosphate additive employed with the ceramic material can be varied depending upon, inter alia, the type of ceramic material and the substrate employed but, in general, an amount of from about 0.5 weight percent to about 60 weight percent is typical with from about 10 weight percent to 40 weight percent being preferred.

The functioning of the phosphate additive is believed to play an important or integral role in not only effectively bonding or adhering the coating composition together and to the substrate by a chemical and/or mechanical means but also in achieving certain desired ferroelectric or piezoelectric properties or characteristics of the resulting coating composition. For example, it has been observed that in reducing the amount of phosphate additive used, that is, phosphoric acid, the properties of the resulting coating were varied with its dielectric constant reduced, its resistivity increased, and its dielectric strength increased.

It is oftentimes advantageous to utilize a water soluble hexapositive oxychromium compound or mixtures of such compounds along with the phosphate additive in the present invention. Depending upon, inter alia, the particular phosphate additive and substrate used, the coatings are typically more dense and better adhered to the substrate. Such oxychromium materials include chromic acid, the alkali metal chromates and dichromates such as sodium, potassium lithium chromates and dichromates and the like, ammonium chromate and dichromate, the alkaline earth metal chromates and dichromates, such as calcium, magnesium, strontium and barium chromates and dichromates and the like, including mixtures of the foregoing. The oxychromium material can be used in various weight percentages with the phosphate additive and preferably from about 1% to about 50% with from about 5% to about 25% being typically preferred. In general, the use of greater proportions of phosphate additive to the oxychromium material increases the dielectric constant and drive characteristics of the coating; whereas, a greater proportion of oxychromium material to phosphate additive decreases the dielectric constant.

In certain instances further advantages are obtained by employing a water soluble ferric material with the phosphate additive and, if utilized, the oxychromium material. Typically, the ferric material gives additional strength to the bond. Any ferric material can be used and such includes ferric oxide, ferric salts, such as ferric phosphate and ferric chromate and dichromate, as well as other water soluble ferric chelate materials such as ferric EDTA (ethylenediaminetetraacetic acid) and the like, and mixtures of the foregoing. The ferric material when used as other than a phosphate, chromate or dichromate can be used in various weight percentages to the phosphate additive and preferably from about 1% to about 50% with from about 10% to about 40% being typically preferred.

The ceramic material water and phosphate additive can be admixed in various proportions to form the aqueous slurry. In general, the proportion of water used is only that needed to form an aqueous slurry of the desired consistency and depends primarily on the type and amount of phosphate additive used. The water is typically used in amounts of from about 10 weight percent to 60 weight percent of the slurry with a range of about 30% to about 50% by weight being preferred.

The ceramic powder, phosphate additive, and water can be admixed simultaneously or in any order to form the slurry. For example, the ceramic powder and phosphate additive can be admixed and then the water added thereto, or the phosphate additive and water can first be admixed and then the ceramic powder is added and admixed therewith. The aqueous slurry should have a pH below about 1, and preferably below about 0.5. Depending upon, inter alia, the type of substrate material, a pH of less than 0.0 can be used in certain instances. It may be necessary to adjust the pH to the desired acidic condition by using an acid, salt or base in a conventional manner. The resulting aqueous slurry should be thoroughly mixed or blended and then deposited on the substrate.

The coating composition can be applied to the substrate in any desired thickness depending upon, inter alia, its desired application or use. In general, for a ferroelectric coating the coatings typically are no thicker than about 100 mils with a thickness of from about 5 mils to 40 mils being preferred and for a piezoelectric coating the coatings typically are no thicker than about 60 mils with below about 30 mils being preferred and from about 5 mils to about 20 mils being especially preferred.

The means used for depositing the aqueous slurry on the substrate can be varied depending upon, inter alia, the viscosity of the slurry and include such conventional means as dipping the substrate into the slurry, painting the slurry on the substrate, spraying the slurry on the substrate, or using a silk-screen technique to apply the coating to the substrate.

After the coating composition has been deposited on the substrate it is then cured or dried. This process step is temperature and time dependent. In general, the coating composition can be air dried at room temperature but such usually requires several hours. The more elevated temperatures used the less drying time required, although it is important that not too high a temperature be used since this may result in decreasing the dielectric constant of the composition. Typical temperatures for curing are below about 600° C. and preferably from about 100° to about 400° C. The flexural strength of the resulting composite of the metal substrate with the coating composition adhered thereon is superior to a conventional ceramic material of the same thickness. For example, a 20 mil thick coating composition adhered to a metal substrate can withstand bending on a 3 inch radius without affecting performance. Ordinary ceramic material will not withstand such a degree of bending without breaking or affecting performance.

The resulting bonded composite of the coating composition and substrate can be further processed in any conventional manner depending upon its desired application. For example, if the substrate is a metal material, such as aluminum, a top electrode may then be applied to the top layer of the exposed coating composition surface by a number of conventional deposition techniques including electroplating, painting or spraying using a conductive material such as silver, platinum, palladium, copper, graphite and the like. The device can then be polarized in any conventional manner to produce a device with ferroelectric or piezoelectric characteristics.

In order to illustrate the present invention, the following examples are presented with parts and percentages being by weight unless otherwise specified.

EXAMPLE 1

A 440 ml. solution (pH of less than 0.0 at 28° C.) is prepared by admixing the following:
50 ml. $KH_2PO_4$ solution (5 grams of $KH_2PO_4$ dissolved in 50 ml. water)
100 ml. chromic acid solution (10 grams of $CrO_3$ dissolved in 100 ml. water)
90 ml. $H_3PO_4$ (85% solution)
200 ml. water A lead zirconate-titanate powder, 52% zirconate to 47% titanate material and which includes niobium, commercially available as "PZT-5" from Vernitron Corporation, with a particle size less than 63 micrometers (U.S. Sieve — 230 mesh) is admixed with the above solution on the basis of a gram of powder to each ml. of solution to form a slurry.

The slurry is applied to aluminum substrates (2 × 2 inches by brushing with a coverage of 0.75 grams of slurry per square inch of substrate surface. The composites are allowed to air dry at room temperature (about 35° C.) for about 15 minutes and then cured in an oven at a temperature of about 160° C. for about 5 to 10 minutes.

The resulting composite articles of a substrate with a coating (about 13 mils thick) adhered thereto are painted by brush over the exposed coating layer with silver paint and allowed to dry to form electrodes. The composite articles are poled by applying a DC voltage of approximately 500 volts for 5 seconds.

The composite piezoelectric articles exhibit the following typical values:
Sensitivity (voltage) — 100 volts per mil
Capacitance — dielectric constant — 600
Resistivity (4 square inches) — 2 mega ohms

EXAMPLE 2

A 414 ml. solution (pH of about 0.3 at 28° C.) is prepared by admixing the following:
60 ml. $KH_2PO_4$ solution (6 grams of $KH_2PO_4$ dissolved in 50 ml. water)
100 ml. chromic acid solution (10 grams of $CrO_3$ dissolved in 100 ml. water)
54 ml. $H_3PO_4$ (85% solution)
200 ml. water A lead zirconate-titanate powder (PZT-5) with a particle size less than 63 micrometers is admixed with the above solution on the basis of a gram of powder to each milliliter of solution to form a slurry.

The slurry is applied to aluminum substrates (2 × 2 inches) by brushing with a coverage of 0.75 grams of slurry per square inch of substrate surface. The composites are allowed to air dry at room temperature (about 35° C.) for about 15 minutes and then heated in an oven at a temperature of about 160° C. for about 5 to 10 minutes.

The resulting composite articles of a substrate with a coating adhered thereto are painted by brush over the exposed coating layer with silver paint and allowed to dry to form electrodes. The composite articles are poled by applying a D.C. voltage of approximately 500 volts for 5 seconds.

The composite articles exhibit the following typical values:
Sensitivity (voltage) — 200 volts per mil
Capacitance — dielectric constant — 300
Resistivity (4 square inches) — 50 mega ohms This article can be used as a capacitor.

EXAMPLE 3

An acidic aqueous slurry (pH of about 0.6 at 25° C.) is prepared with the following materials:
4 ml. $H_3PO_4$ (20% solution)
5 ml. $MgCr_2O_7$ (10% solution)
0.3 g. $Fe_2O_3$
3 g. piezoelectric powder (lead zirconate-titanate, PZT-5)
15 ml. water The slurry is applied by brush to a nickel substrate (2 × 2 inches) and air dried at room temperature (30° C.) for approximately 15 minutes. The composite article is heated in an oven at 150° C. for about 15 minutes in order to cure the coating composition. The composite is thereafter electroded with silver paint being applied to the exposed surface and polarized with 500 volts (D.C.) for approximately 10 seconds.

The resulting composite article exhibits good piezoelectric properties and the coating composition is effectively bonded to the substrate.

EXAMPLES 4–11

In a similar manner to the preceding examples and utilizing the indicated phosphate additives (pH less than 1 at 25° C.), substrates and piezoelectric material, composite articles are prepared exhibiting good piezoelectric characteristics and mechanical properties:

| | Phosphate Additives | Substrate Type | Piezoelectric Type Material |
|---|---|---|---|
| 4) | 5 g. $K_2Cr_2O_7$<br>15 ml. $H_3PO_4$<br>(85% solution)<br>100 ml. water | Tin | Barium titanate |
| 5) | 7 g. $MgCr_2O_7$<br>15 ml. $H_3PO_4$<br>(85% solution)<br>100 ml. water | Titanium | Lead metaniobate |
| 6) | 7 g. $(NH_4)_2Cr_2O_7$<br>15 ml. $H_3PO_4$<br>(85% solution)<br>100 ml. water | Silicon | Lead zirconate-titanate |
| 7) | 8 g. $Na_2Cr_2O_7$<br>15 ml. $H_3PO_4$<br>(85% solution)<br>100 ml. water | Graphite | Lead zirconate-titanate |
| 8) | 5 g. $NH_4H_2PO_4$<br>4 g. chromic acid<br>100 ml. water | Steel | Lead metaniobate |
| 9) | 5 g. $Na_2HPO_4$<br>4 g. chromic acid<br>100 ml. water | Molybdenum | Barium titanate |
| 10) | 7 g. $MgH_2PO_4$<br>6 g. chromic acid<br>100 ml. water | "Kovar"<br>29% Ni<br>17% Co<br>0.2% Mn<br>balance iron | Lead zirconate-titanate |
| 11) | 6 g. $KH_2PO_4$<br>6 g. chromic acid<br>100 ml. water | Titanium | Lead zirconate-titanate |

The coating composition can be applied to substrates to form many and various embodiments. For example, a full bimorph embodiment can be prepared by depositing the coating composition on each side of a flat, thin substrate to form a composite of a coating composition - substrate - coating composition. A half bimorph embodiment can be prepared in which the coating composition is adhered to an exposed substrate surface to form a composite of a coating composition - substrate. Still further, a composite embodiment can be prepared of one or more layers of the ferroelectric or piezoelectric material by depositing the coating composition on one layer of such material or forming a sandwich of such material with the coating composition therebetween.

The resulting device with the composite of the substrate having a coating composition bonded thereon can be used in many and various applications where its piezoelectric or ferroelectric characteristics are desired. For example: acoustic generators for both audible and ultrasonic frequencies such as, for audio ranges, earphones, loudspeakers and warning signals and, for ultrasonic ranges, sonar transmitters, proximity detection, remote control, security systems and agitators for cleaning various articles in tanks; acoustic sensors for both the audible and ultrasonic frequencies such as, for audio ranges, microphones, hydrophones, sonar receivers, seismic detectors, remote control receivers and, for ultrasonic ranges, microphones for security systems and proximity detectors; strain sensors for the sensing of the sub-audio through the ultrasonic frequencies such as phonograph pickups; force generators which take advantage of the high force and small displacement characteristics of the piezoelectric materials such as impact "drilling" systems and "inch-worm" micropositioners; pulse generators for providing narrow voltage pulses for synchronizing an electric output with a mechanical system such as automotive ignition timing and ignition spark generators; and frequency control devices which provide sharply-tuned electrical circuits at radio frequencies. In general, voltage generators, acoustic sensors and the like utilize piezoelectric ceramic coating composites characterized by a substantially high-electromechanical coupling coefficient, dielectric constant, and high mechanical and electrical strength. On the other hand, it is desired in filter applications of piezoelectric ceramics coating composites that the materials exhibit a stability with temperature and time in resonant frequency and in other electrical properties. Ferroelectric ceramic coating composites can be employed in capacitors and in memory storage devices.

Having thus described typical or preferred embodiments of the invention, I claim:

1. A method for preparing a composite of a substrate with a dielectric ceramic coating composition adhered thereto comprising forming an acidic aqueous slurry at a pH of less than about 1 by admixing a finely divided dielectric ceramic material, a phosphate additive and water, depositing said slurry as a coating composition on the substrate and drying said composition at a temperature sufficient to adhere said composition to said substrate.

2. A method according to claim 1, wherein said ceramic material is a ferroelectric or piezoelectric powder.

3. A method according to claim 2, wherein said powder material is selected from the group consisting of barium titanate materials, lead zirconate-titanate materials, and lead metaniobate materials.

4. A method according to claim 3, wherein the pH of the acidic aqueous slurry is less than about 0.5 and the drying temperature is from about 100° to about 400° C.

5. A method according to claim 4, wherein said phosphate additive is selected from the group consisting of orthophosphoric acid, sodium orthophosphates, potassium orthophosphates, ammonium orthophosphates and mixtures thereof.

6. A method according to claim 5, wherein said powder material is a lead zirconate-titanate powder material.

7. A method according to claim 5, wherein said aqueous slurry additionally includes a water soluble hexapositive oxychromium material.

8. A method according to claim 7, wherein said oxychromium material is selected from the group consisting of chromic acid, alkali metal chromates, alkali metal dichromates, alkaline earth metal chromates, alkaline earth metal dichromates, ammonium chromates, ammonium dichromates and mixtures thereof.

9. A method according to claim 8, wherein said powder material is a lead zirconate-titanate powder material.

10. A method according to claim 5, wherein said aqueous slurry additionally includes a water soluble ferric material.

11. A method according to claim 10, wherein said ferric material is selected from the group consisting of ferric oxide, water soluble ferric salts, and water soluble ferric chelate compounds.

12. A method according to claim 11, wherein said powder material is a lead zirconate-titanate powder material.

13. A method according to claim 5, wherein said aqueous slurry additionally includes a water soluble hexapositive oxychromium material and a water soluble ferric material.

14. A method according to claim 13, wherein said oxychromium material is selected from the group consisting of chromic acid, alkali metal chromates, alkali metal dichromates, alkaline earth metal chromates, alkaline earth metal dichromates, ammonium chromates, ammonium dichromates and mixtures thereof and said ferric material is selected from the group consisting of ferric oxide, water soluble ferric salts and water soluble ferric chelate materials.

15. A coating composition comprising a ferroelectric or piezoelectric ceramic material which is selected from the group consisting of barium titanate materials, lead zirconate-titanate materials, and lead metaniobate materials, and a phosphate additive admixed therewith in an amount of from about 0.5 weight percent to about 60 weight percent wherein the composition is an acidic aqueous slurry at a pH of less than about 1.

16. The composition according to claim 15, wherein said phosphate additive is selected from the group consisting of orthophosphoric acid, sodium orthophosphates, potassium orthophosphates, ammonium orthophosphates, and mixtures thereof.

17. A composition according to claim 16, wherein said material is a lead zirconate-titanate powder material.

18. A composition according to claim 17 which additionally includes a water soluble hexapositive oxychromium material in an amount of from about 1% to 50% by weight of said phosphate additive.

19. A composition according to claim 18 wherein said oxychromium material is selected from the group consisting of chromic acid, alkali metal chromates, alkali metal dichromates, alkaline earth metal chromates, alkaline earth metal dichromates, ammonium chromates, ammonium dichromates and materials thereof.

20. A composition according to claim 19, wherein said material is a lead zirconate-titanate powder material.

21. A composition according to claim 16, which additionally includes a water soluble ferric material in an amount of from about 1% to about 50% by weight of said phosphate additive.

22. A composition according to claim 21, wherein said ferric material is selected from the group consisting of ferric oxide, water soluble ferric salts and water soluble ferric chelate compounds.

23. A composition according to claim 22, wherein said material is a lead zirconate-titanate powder material.

24. A composition according to claim 16, which additionally includes a water soluble hexapositive oxychromium material selected from the group consisting of chromic acid, alkali metal chromates, alkali metal dichromates, alkaline earth metal chromates, alkaline earth metal dichromates, ammonium chromates, ammonium dichromates and mixtures thereof and a water soluble ferric material selected from the group consisting of ferric oxide, water soluble ferric salts and water soluble ferric chelate materials, said additional materials being in an amount from about 1% to about 50% by weight of said phosphate additive.

25. A composition according to claim 24, wherein said material is a lead zirconate-titanate powder material.

26. A composite article comprising a substrate and a dried coating composition adhered thereon prepared from an acidic aqueous slurry comprising a ferroelectric or piezoelectric ceramic powder material and a phosphate additive in an amount of from about 0.5 weight percent to about 60 weight percent of said material.

27. A composite article according to claim 26, wherein said substrate material is selected from the group consisting of metallic substrates and inorganic dielectric ceramic substrates and said phosphate additive is selected from the group consisting of orthophosphoric acid, sodium orthophosphates, potassium orthophosphates, ammonium orthophosphates and materials thereof.

28. A composite article according to claim 27, wherein said substrate is a metallic substrate selected from the group consisting of aluminum, nickel, tin, titanium, silicon, molybdenum, graphite, steel, and alloys containing any of the foregoing in predominant amounts and said material is lead selected from the group consisting of barium, titanate materials, lead zirconate-titanate materials, and lead metaniobate materials.

29. A composite article according to claim 28, wherein said material is a lead zirconate-titanate material.

30. A composite article according to claim 28, wherein said coating composition additionally includes a water soluble hexapositive oxychromium material in an amount of from about 1% to 50% by weight of said phosphate additive.

31. A composite article according to claim 30, wherein said oxychromium material is selected from the group consisting of chromic acid, alkali metal chromates, alkali metal dichromates, alkaline metal chromates, alkaline metal dichromates, ammonium chromates, ammonium dichromates, and mixtures thereof.

32. A composite article according to claim 31, wherein said material is a lead zirconate-titanate material.

33. A composite article according to claim 28, wherein said coating composition additionally includes a water soluble ferric material in an amount of from about 1% to 50% by weight of said phosphate additive.

34. A composite article according to claim 33, wherein said ferric material is selected from the group consisting of ferric oxide, water soluble ferric salts, and water soluble ferric chelate compositions.

35. A composite article according to claim 34, wherein said material is a lead zirconate-titanate material.

36. A composite article according to claim 28, wherein said coating composition additionally includes an oxychromium material selected from the group consisting of chromic acid, alkali metal chromates, alkali metal dichromates, alkaline earth metal chromates, alkaline earth metal dichromates, ammonium chromates, ammonium dichromates and mixtures thereof and a ferric material selected from the group consisting of ferric oxide, water soluble ferric salts and water soluble ferric chelate materials, said additional materials being in an amount of from about 1% to about 50% by weight of said phosphate additive.

37. A composite article according to claim 36, wherein said material is a lead zirconate-titanate material.

* * * * *